(12) United States Patent
Bayn et al.

(10) Patent No.: US 11,480,728 B2
(45) Date of Patent: Oct. 25, 2022

(54) PIXEL ARRAY IMPLEMENTED ON PHOTONIC INTEGRATED CIRCUIT (PIC)

(71) Applicant: Apple Inc., Cupertino, CA (US)

(72) Inventors: Igal I. Bayn, New York, NY (US); Alexander Shpunt, Portola Valley, CA (US); Arman Hajati, San Mateo, CA (US)

(73) Assignee: APPLE INC., Cupertino, CA (US)

( * ) Notice: Subject to any disclaimer, the term of this patent is extended or adjusted under 35 U.S.C. 154(b) by 235 days.

(21) Appl. No.: 16/858,828

(22) Filed: Apr. 27, 2020

(65) Prior Publication Data

US 2020/0393615 A1 Dec. 17, 2020

Related U.S. Application Data

(60) Provisional application No. 62/860,267, filed on Jun. 12, 2019.

(51) Int. Cl.
| | |
|---|---|
| G02B 6/12 | (2006.01) |
| G02B 6/13 | (2006.01) |
| H01S 5/042 | (2006.01) |
| H01S 5/40 | (2006.01) |
| H01S 5/026 | (2006.01) |
| H01S 5/02 | (2006.01) |

(52) U.S. Cl.
CPC ........... *G02B 6/12004* (2013.01); *G02B 6/13* (2013.01); *H01S 5/021* (2013.01); *H01S 5/026* (2013.01); *H01S 5/0208* (2013.01); *H01S 5/0427* (2013.01); *H01S 5/4093* (2013.01); *G02B 2006/12121* (2013.01); *G02B 2006/12142* (2013.01); *G02B 2006/12147* (2013.01); *H01S 5/4012* (2013.01)

(58) Field of Classification Search
CPC .................. G02B 6/12004; G02B 6/13; G02B 2006/12121; G02B 2006/12142; G02B 2006/12147; H01S 5/0208; H01S 5/021; H01S 5/026; H01S 5/0427; H01S 5/4093; H01S 5/4012
USPC ......................................................... 385/14
See application file for complete search history.

(56) References Cited

U.S. PATENT DOCUMENTS

| | | | |
|---|---|---|---|
| 5,946,331 A | 8/1999 | Amersfoort et al. | |
| 7,103,244 B2 | 9/2006 | Chen et al. | |
| 7,885,492 B2 | 2/2011 | Welch et al. | |
| 2017/0351025 A1* | 12/2017 | Trita | G02B 6/1228 |
| 2020/0225332 A1* | 7/2020 | Wagner | G01S 7/4863 |
| 2021/0311333 A1* | 10/2021 | Thomas | H01S 5/0265 |

\* cited by examiner

*Primary Examiner* — Jerry M Blevins
(74) *Attorney, Agent, or Firm* — Kligler & Associates Patent Attorneys Ltd

(57) ABSTRACT

An optoelectronic device includes a substrate and at least three emitters, which are disposed on the substrate and are configured to emit respective beams of light. A plurality of waveguides are disposed on the substrate and have respective input ends coupled to receive the beams of light from respective ones of the emitters, and curve adiabatically from the input ends to respective output ends of the waveguides, which are arranged on the substrate in an array having a predefined pitch. Control circuitry is configured to apply a temporal modulation independently to each of the beams of light.

13 Claims, 7 Drawing Sheets

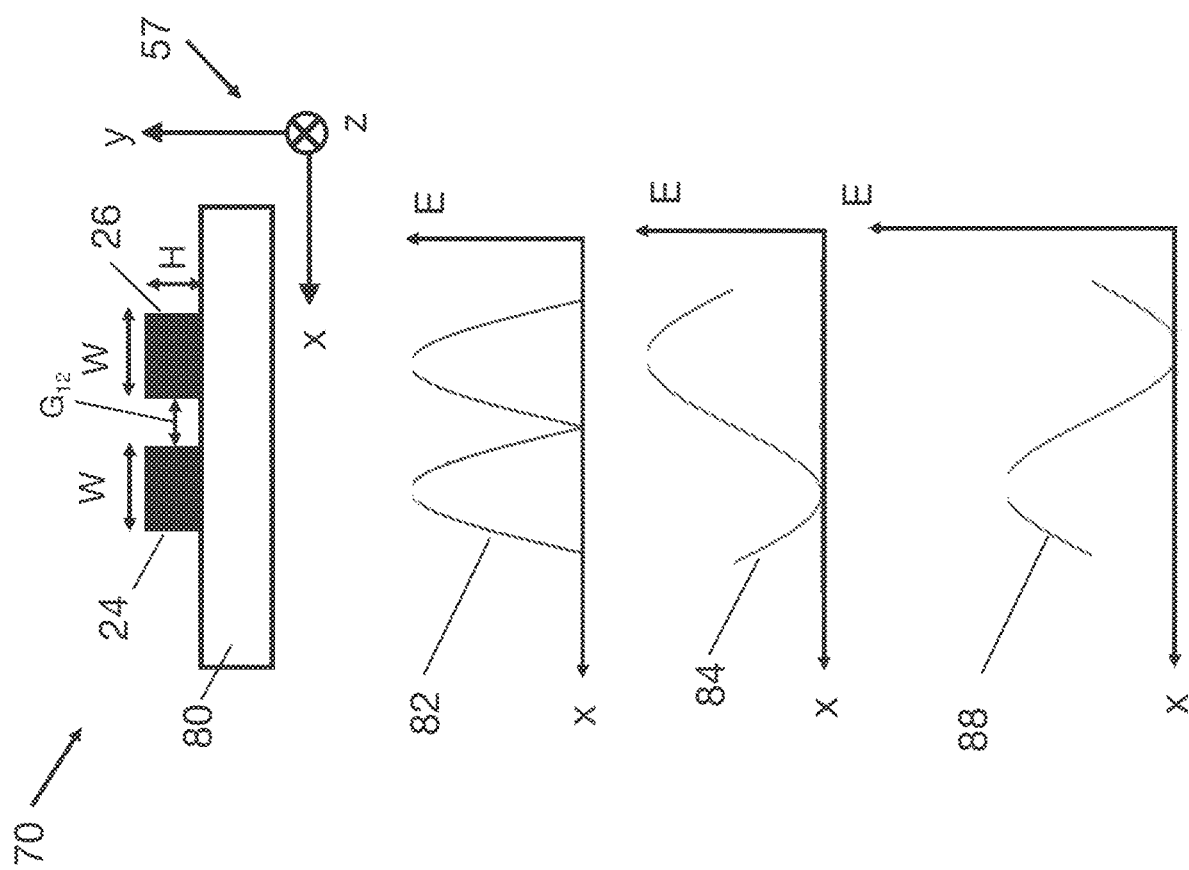

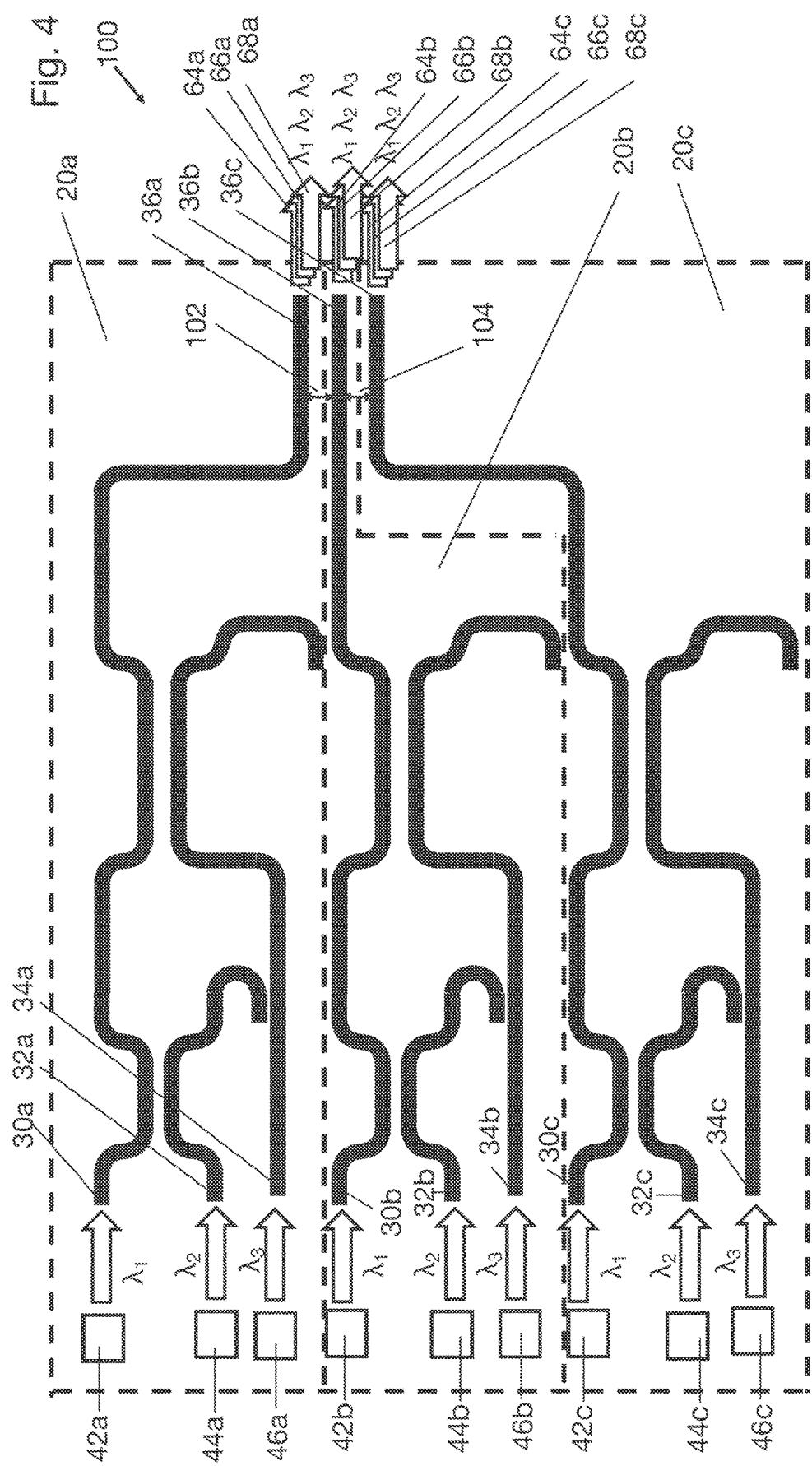

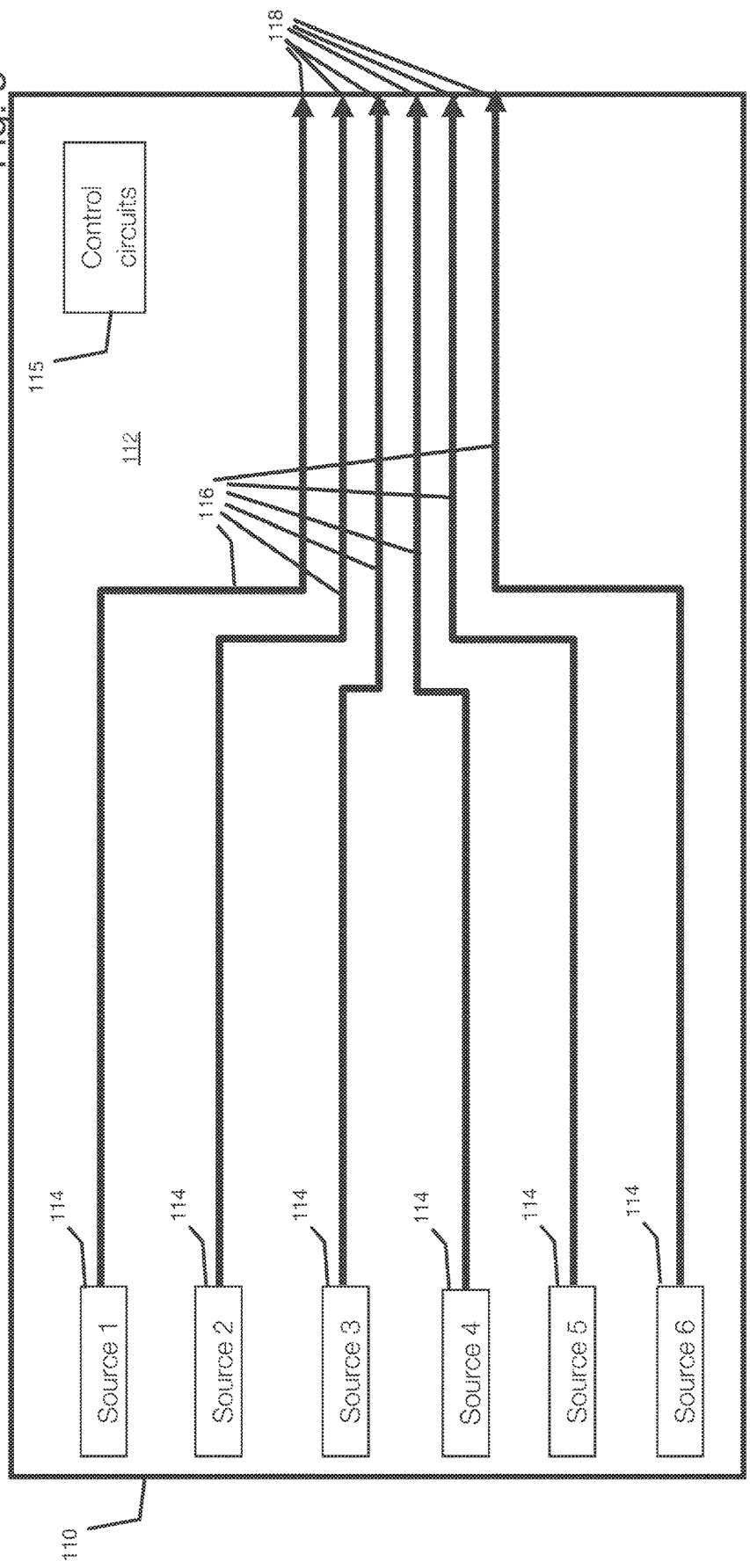

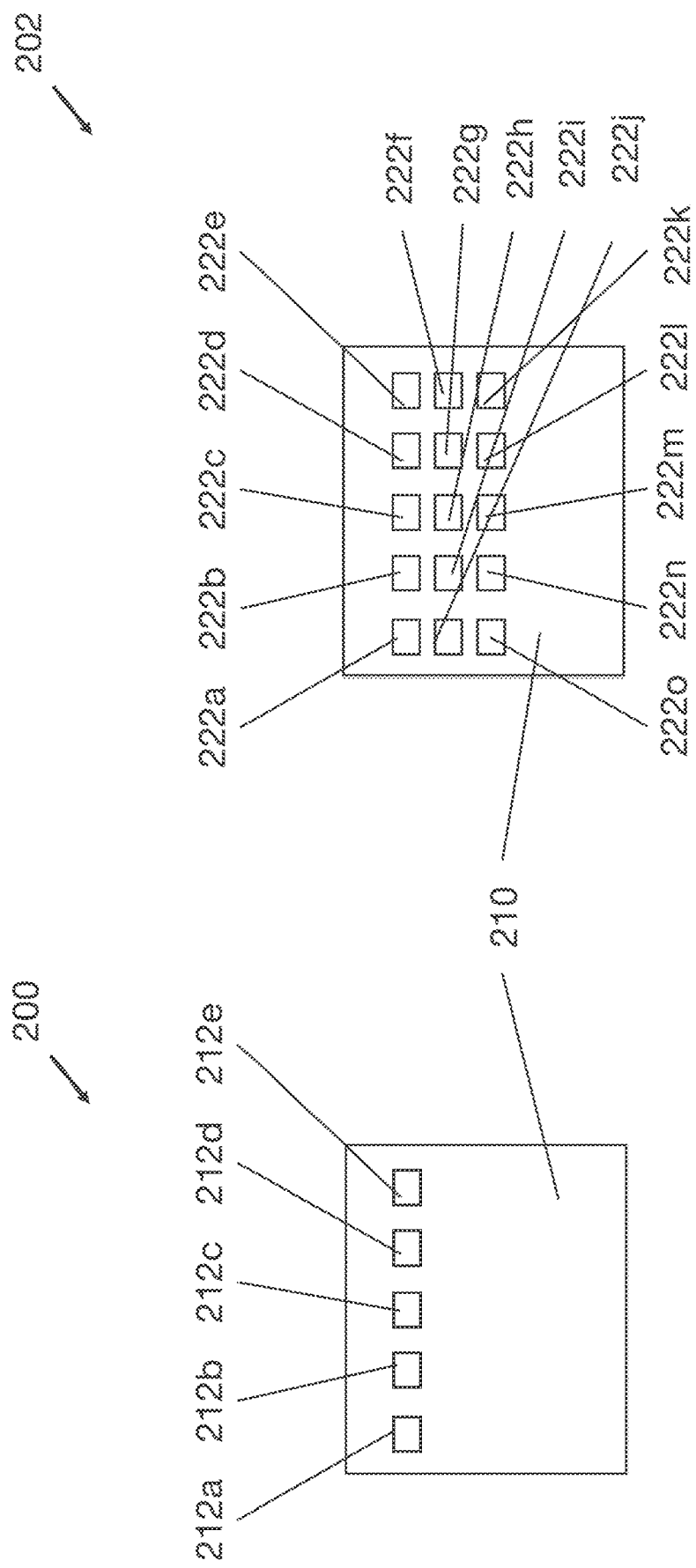

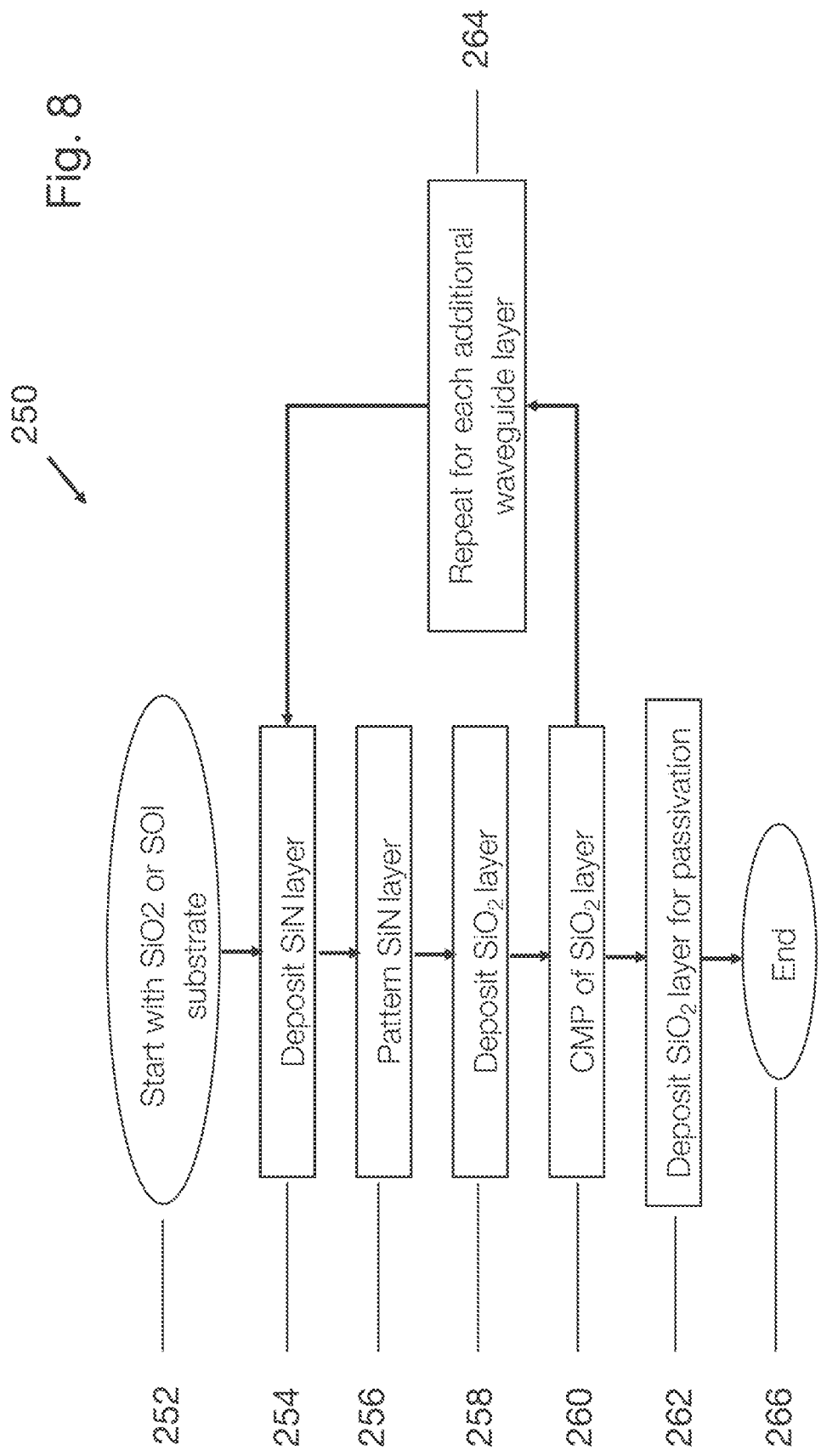

PIXEL ARRAY IMPLEMENTED ON PHOTONIC INTEGRATED CIRCUIT (PIC)

CROSS-REFERENCE TO RELATED APPLICATION

This application claims the benefit of U.S. Provisional Patent Application 62/860,267, filed Jun. 12, 2019, which is incorporated herein by reference.

FIELD OF THE INVENTION

The present invention relates generally to optoelectronic devices, and particularly to photonic integrated circuits.

BACKGROUND

Laser-based light engines for miniaturized projectors use a light combiner to combine light of different colors from multiple sources. (The terms "optical radiation" and "light" as used in the present description and in the claims refer generally to any and all of visible, infrared, and ultraviolet radiation.) The visible spectrum generally comprises wavelengths from 400 nm to 700 nm. In visual display applications it is customary to refer to the three wavelength ranges of red, green, and blue as RGB, wherein the central wavelengths are, for example, 640 nm for red, 532 nm for green, and 450 nm for blue. Depending on the types of sources that are used, the RGB wavelengths may also comprise a width of a spectrum around the central wavelength, such as 10 nm, 20 nm, or other spectral widths. Additionally, the combiner may also be required to combine radiation outside the visible spectrum, such as infrared (IR) radiation, used for example for mapping the illuminated scene.

SUMMARY

Embodiments of the present invention provide improved device and methods for pixel projection.

There is therefore provided, in accordance with an embodiment of the invention, an optoelectronic device including a substrate and at least three emitters, which are disposed on the substrate and are configured to emit respective beams of light. A plurality of waveguides are disposed on the substrate and have respective input ends coupled to receive the beams of light from respective ones of the emitters, and curve adiabatically from the input ends to respective output ends of the waveguides, which are arranged on the substrate in an array having a predefined pitch. Control circuitry is configured to apply a temporal modulation independently to each of the beams of light.

In some embodiments, the emitters include at least first emitters and second emitters, which are configured to emit the light at least at different, first and second respective wavelengths. In one embodiment, the emitters are configured to emit the light at first, second and third wavelengths in blue, green and red wavelength ranges, respectively.

In a disclosed embodiment, the pitch does not exceed 10 microns.

In one embodiment, the array of the output ends is a one-dimensional array. Alternatively, the waveguides are disposed on the substrate in multiple layers, and the array of the output ends is a two-dimensional array.

In a disclosed embodiment, the output ends define pixels in the array, and the control circuitry is configured to modulate the beams emitted by the emitters so as to modulate respective colors and intensities of the pixels.

The substrate may include a semiconductor material or a dielectric material.

In a disclosed embodiment, the emitters include lasers, which are disposed on the substrate. Additionally or alternatively, the waveguides include strip waveguides formed on the substrate. In one embodiment, the strip waveguides are single-mode waveguides.

In some embodiments, the emitters and waveguides are arranged on the substrate in a plurality of photonic integrated sub-circuits, each sub-circuit including a first emitter configured to emit a first beam of light at a first wavelength and a second emitter configured to emit a second beam of light at a second wavelength, which is longer than the first wavelengths. First and second waveguides are disposed along respective first and second paths on the substrate and have respective input ends coupled to receive the first and second beams of light respectively, the first and second paths curving adiabatically from the input ends into a coupling region in which the first and second paths are separated by a gap that is selected such that over a length of the coupling region, at least 80% of an optical flux of the second beam traverses the gap from the second waveguide into the first waveguide, whereupon the light at both the first and second wavelengths is transmitted through an output end of the first waveguide.

There is also provided, in accordance with an embodiment of the invention, a photonic integrated circuit, including a semiconductor substrate, a first emitter configured to emit a first beam of light at a first wavelength, and a second emitter configured to emit a second beam of light at a second wavelength, which is longer than the first wavelengths. First and second waveguides are disposed along respective first and second paths on the semiconductor substrate and have respective input ends coupled to receive the first and second beams of light respectively, the first and second paths curving adiabatically from the input ends into a coupling region in which the first and second paths are separated by a gap that is selected such that over a length of the coupling region, at least 80% of an optical flux of the second beam traverses the gap from the second waveguide into the first waveguide, whereupon the light at both the first and second wavelengths is transmitted through an output end of the first waveguide.

In a disclosed embodiment, the length of the coupling region is selected so that less than 20% of the optical flux of the first beam traverses the gap from the first waveguide into the second waveguide.

In some embodiments, the coupling region between the first and second paths is a first coupling region characterized by a first length and a first gap, and the circuit includes a third emitter configured to emit a third beam of light at a third wavelength, which is longer than the second wavelength, and a third waveguide, which is disposed along a third path on the substrate and has an input end coupled to receive the third beam of light, the first and third paths curving adiabatically from the input ends into a second coupling region subsequent to the first coupling region, wherein the first and third paths are separated in the second coupling region by a second gap that is selected such that over a second length of the second coupling region, at least 80% of the optical flux of the third beam traverses the gap from the third waveguide into the first waveguide, whereupon the light at all of the first, second and third wavelengths is transmitted through an output end of the first waveguide. In one embodiment, the first, second and third wavelengths are blue, green and red wavelengths, respectively.

There is additionally provided, in accordance with an embodiment of the invention, an optoelectronic device including a plurality of photonic integrated sub-circuits, disposed on a common semiconductor substrate. Each sub-circuit includes a first emitter configured to emit a first beam of light at a first wavelength and a second emitter configured to emit a second beam of light at a second wavelength, which is longer than the first wavelengths. First and second waveguides are disposed along respective first and second paths on the substrate and have respective input ends coupled to receive the first and second beams of light respectively, the first and second paths curving adiabatically from the input ends into a coupling region in which the first and second paths are separated by a gap that is selected such that over a length of the coupling region, at least 80% of an optical flux of the second beam traverses the gap from the second waveguide into the first waveguide, whereupon the light at both the first and second wavelengths is transmitted through an output end of the first waveguide.

In a disclosed embodiment, the photonic integrated sub-circuits are disposed on the substrate so that respective output ends of the sub-circuits are arranged in an array having a predefined pitch.

The present invention will be more fully understood from the following detailed description of the embodiments thereof, taken together with the drawings in which:

BRIEF DESCRIPTION OF THE DRAWINGS

FIG. 2 is a schematic sectional view of the PIC of FIG. 1, in accordance with an embodiment of the invention;

FIGS. 3*a*, 3*b* and 3*c* are schematic plots of waveguide modes propagating in a PIC, in accordance with an embodiment of the invention;

FIG. 4 is a schematic top view of a PIC, in accordance with an alternative embodiment of the invention;

FIG. 5 is a schematic top view of an optoelectronic device, in accordance with another embodiment of the invention;

FIGS. 7A and 7B are schematic sectional views of single-layer and triple-layer photonic integrated circuits, respectively, in accordance with embodiments of the invention; and FIG. 8 is flowchart that schematically illustrates methods for fabricating photonic integrated circuits, in accordance with an embodiment of the invention.

DETAILED DESCRIPTION OF EMBODIMENTS

Overview

Figure 1:
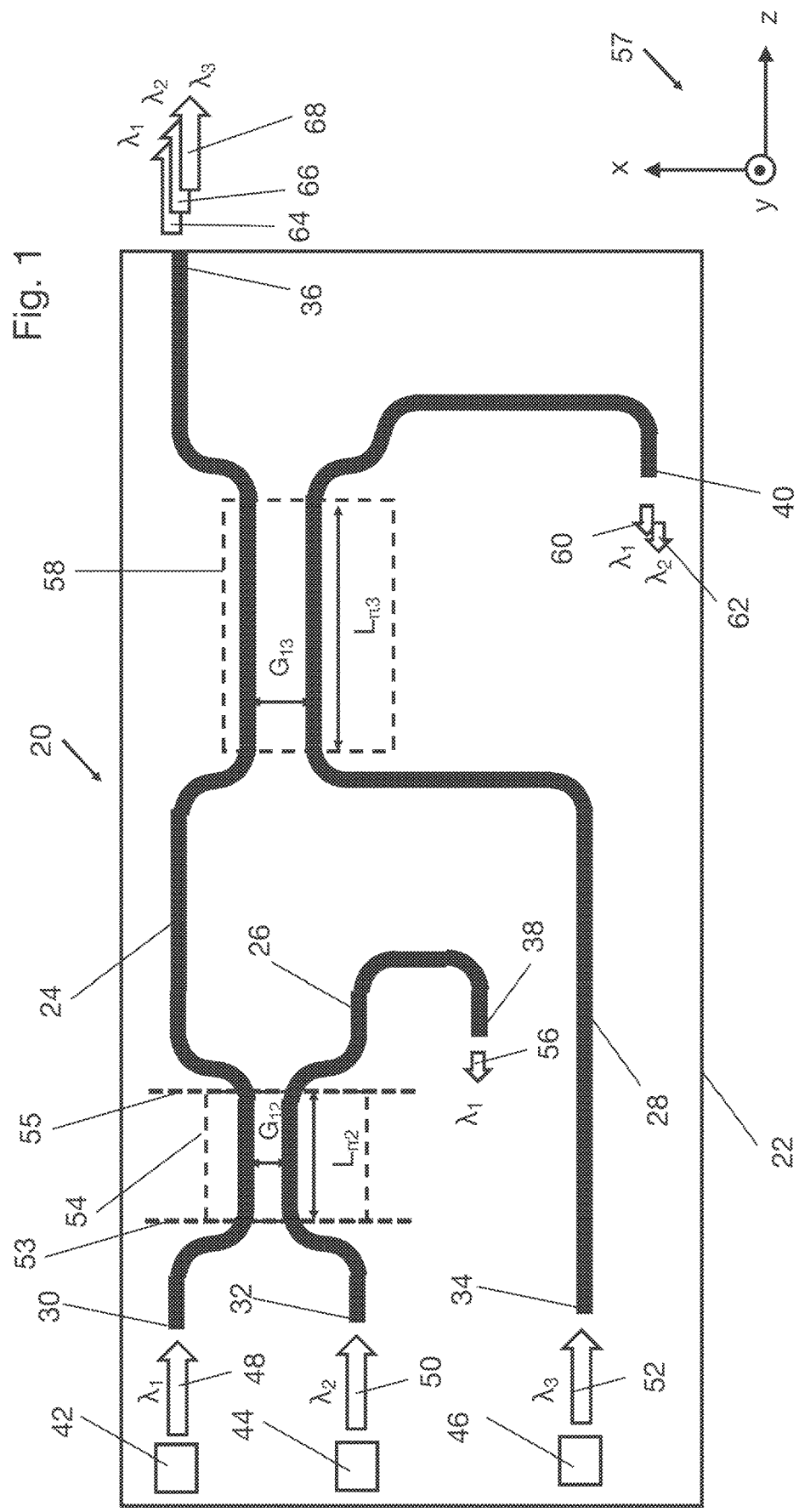
FIG. 1 is a schematic top view of a photonic integrated circuit (PIC), in accordance with an embodiment of the invention.

Miniaturized projectors for visual applications require a compact and efficient pixel generator for light at wavelengths in the visible spectrum. The pixel generator is commonly integrated in a laser engine, wherein the input light is provided by lasers at the RGB wavelengths, and possibly other wavelengths, and a scanner may scan the combined optical radiation for generating a two-dimensional image. There is a need for pixel generators that are compact, robust, and inexpensive to manufacture.

The embodiments of the present invention that are described herein address the above needs so as to provide a robust and efficient photonic integrated circuit (PIC) comprising a pixel generator, which outputs a row or matrix of pixels. Each pixel may comprise a single color, generated by a single emitter, whose intensity is modulated on the PIC. Alternatively, multiple different colors, for example in red, green and blue beams, can be combined on the PIC from different, respective emitters. In some embodiments, the pixel outputs are temporally modulated and fed to a scanning projector, such as a rotating mirror with suitable projection optics, in order to project a two-dimensional image.

In some embodiments, an optoelectronic device comprises at least three emitters, which are disposed on a substrate, such as a semiconductor or dielectric substrate, and emit respective beams of light. Waveguides on the substrate have respective input ends coupled to receive the beams of light from respective emitters, and curve adiabatically from the input ends to their output ends, which are arranged on the substrate in an array. Control circuitry, which may be formed or placed on the same substrate as the emitters and waveguides, applies a temporal modulation independently to each of the beams of light. The temporal modulation may be driven, for example, so that the light emitted from the output ends of the waveguides defines successive pixels of a projected image. For this purpose, the control circuitry may modulate both respective colors and intensities of the pixels.

The array of output ends of the waveguides can serve as a condenser of the beams, meaning that the pitch of the array of output ends is much smaller than the distance between the input ends. For example, the output ends may be no more than 10 microns apart. The output ends of the waveguides may be arranged in a one-dimensional array. Alternatively, the waveguides may be disposed on the substrate in multiple layers, so that the output ends form a two-dimensional array.

In some embodiments, the pixel generator comprises a PIC-based multi-wavelength combiner. The combiner is based on an integrated directional coupler, which is capable of functioning over a broad spectral range (although individual designs are typically wavelength-specific). The embodiments may also incorporate emitters of optical radiation and optical modulators, and multiple emitters and combiners of this sort may be combined to produce one- and two-dimensional arrays of pixels, for example RGB pixels, each of which outputs light at multiple wavelengths.

In the disclosed embodiments, a photonic integrated circuit comprises at least a first emitter and a second emitter, emitting beams of light at first and second wavelengths $\lambda_1$ and $\lambda_2$, respectively, wherein $\lambda_1 < \lambda_2$, together with a light combiner functioning at these two wavelengths. The light combiner comprises a first strip waveguide and a second strip waveguide disposed on a semiconductor substrate, with the first emitter emitting its beam of light into an input end of the first waveguide, and the second emitter emitting its beam into an input end of the second waveguide. To increase coupling efficiency from lasers into the waveguides, the ends of the waveguides can be tapered adiabatically to improve mode overlap and consequently enhance power coupling between the lasers and the waveguides. The transverse dimensions of the first and second waveguides are typically identical. The paths of the two waveguides curve adiabatically from their respective input ends into a directional coupling region in which the two paths are separated by a gap that is on the order of $\lambda_1$ and $\lambda_2$ over a length $L_\pi$.

The size of the gap and the length of the coupling region are selected so as to facilitate mode coupling between the waveguides for the light at wavelength $\lambda_2$. For example, the gap may be less than three times $\lambda_2$. In the disclosed embodiments, these parameters are selected such that, over the length $L_\pi$, at least 80% of the optical flux of the second beam traverses the gap from the second waveguide into the first waveguide. At the same time, because of the difference in mode structure at the two wavelengths, less than 20% of the optical flux of the first beam is transferred from the first waveguide into the second waveguide. Thus, the light at both the first and second wavelengths is transmitted through the output end of the first waveguide.

In some embodiments, the photonic integrated circuit includes multiple directional couplers of this sort, with respective lengths and gaps chosen to selectively transfer the optical flux at different wavelengths. For example, a first coupler may transfer green light output by a green laser emitter into a waveguide carrying blue light from a blue laser emitter. A second coupler may transfer red light output by a red laser emitter into this same waveguide. The waveguide will then output a beam that includes red, green and blue components. The actual output color and intensity can be modulated by modulating the individual emitters or by means of external variable optical attenuators (VOAs), which can be implemented and integrated on the same PIC. As noted earlier, multiple sets of emitters and couplers of this sort can be combined to produce an integrated, multi-pixel light engine.

Wavelength Coupler Design

FIG. 1 is a schematic illustration of a photonic integrated circuit (PIC) 20, in accordance with an embodiment of the invention.

Photonic integrated circuit 20 comprises a substrate 22, onto which three single-mode strip waveguides 24, 26, and 28 are formed. (The term "strip waveguide" refers to a waveguide that is formed on a substrate and typically has a lateral dimension that does not exceed a few hundreds of nanometers or a few microns, such as 500 nm or 2 microns. The term "single-mode waveguide" refers to a waveguide, which is capable of propagating only a single transverse mode.) Waveguides 24, 26, and 28 have respective input ends 30, 32, and 34, and respective output ends 36, 38, and 40.

Photonic integrated circuit 20 further comprises three emitters 42, 44, and 46, for example semiconductor laser diodes, which emit beams of light at wavelengths $\lambda_1$, $\lambda_2$, and $\lambda_3$ to input ends 30, 32, and 34, respectively, as indicated by arrows 48, 50, and 52. For example, wavelengths $\lambda_1$, $\lambda_2$, and $\lambda_3$ may be in the blue, green and red ranges of the visible spectrum, respectively. The laser diodes could be integrated on PIC 20 with their resonator implemented in the waveguide layers or butt-coupled to the chip. In the latter case, the laser diodes and the PIC can be mounted on an optical interposer. Input ends 30, 32, may be narrowed or widened to accommodate better coupling of the diode mode.

The light that has entered input ends 30, 32, and 34 propagates into respective waveguides 24, 26, and 28 as optical fluxes $\Phi_1$, $\Phi_2$, and $\Phi_3$, respectively. Output end 36 will emit the main portion of optical fluxes $\Phi_1$, $\Phi_2$, and $\Phi_3$, whereas output ends 38 and 40 emit minor amounts of optical flux resulting from crosstalk or incomplete traverse of optical flux between waveguides, as will be detailed below. These fluxes could be coupled into monitoring detectors (not shown in the figures).

The paths of waveguides 24 and 26 curve adiabatically from input ends 30 and 32 into a first coupling region 54, starting at a line 53 and ending at a line 55, within which the two waveguides run in parallel, separated by a gap $G_{12}$, for a length $L_{\pi 2}$. The term "adiabatically" refers to a bending of the waveguides with radius that is sufficiently large to minimize radiative and mode mismatch losses. (A bend radius on the order of ~30 microns is generally sufficient for this purpose in the visible light range.) The described structure of waveguides 24 and 26, comprising first coupling region 54 and adiabatically curving approaches of the waveguides outside the coupling region creates a directional coupler between the waveguides.

Most of the optical flux $\Phi_2$ at wavelength $\lambda_2$ that enters first coupling region 54 at line 53 within waveguide 26 traverses gradually into waveguide 24. The ratio T of the traversed optical flux $\Phi_{traversed}$ to the initial optical flux at line 53, $\Phi_{in}$, at a given propagation length L is given by equation (1), below:

$$T = \left(\frac{\Phi_{traversed}}{\Phi_{in}}\right) = \left|\sin\left(\frac{\pi}{2} \cdot \frac{L}{L_\pi}\right)\right|^2 \quad (1)$$

The parameter $L_\pi$ in equation (1) is termed the "coupling length," and it denotes the propagation length L at which all of the initial optical flux $\Phi_{in}$ has traversed to waveguide 24 (T=1). The coupling length $L_{\pi 2}$ is calculated from gap $G_{12}$, wavelength $\lambda_2$, and the geometry of waveguides 24 and 26, as well as the properties materials of the waveguides and substrate 22. For the purpose of maximal traverse of the flux, the length of first coupling region 54 is set to be $L_{\pi 2}$, wherein the subscript 2 refers to wavelength $\lambda_2$.

When the two waveguides are positioned in close proximity one to another, they form two modes, symmetric and antisymmetric, as shown in FIGS. 3a and 3b. These two modes have effective indices that are close to that of the original waveguide index $n_{eff}$, i.e., $n_{eff\_sym} \sim n_{eff\_asym} \sim n_{eff}$, and $|n_{eff\_sym} - n_{eff\_asym}| \ll n_{eff}$. The effective index of each of the modes can be found by solving wave equations in the plane perpendicular to propagation and assuming that the mode profile varies only in phase while propagating. At the plane of line 53, the light at wavelength $\lambda_2$ is present only in the bottom branch and not in the top. Therefore, the only two valid solutions to the wave equation are the symmetric and antisymmetric modes. The field at line 53 can thus be represented as $E(Z53) = E_{sym} - E_{asym}$. After propagating over a distance L, each one of the modes accumulates its own phase, i.e., $$E(Z53+L) = E_{sym} \times \exp(jk_2 \times n_{sym} \times L) - E_{asym} \times \exp(jk_2 \times n_{asym} \times L)$$

$$= \exp(jk_2 \times n_{sym} \times L) \times [E_{sym} - E_{asym} \times \exp(jk_2 \times (n_{asym} - n_{sym}) \times L)].$$

Thus, when $L = L_\pi$, the relative phase of the asymmetric mode is equal to $\pi$, because $jk_2 \times (n_{asym} - n_{sym}) \times L_\pi = \pi$, wherein $k_2$ is the wavenumber ($k_2 = 2\pi/\lambda_2$)). When the length of coupling region 54 is set so that $L_\pi$ is reached at line 55, $E(Z_{55} = Z_{54} + L_\pi) = E_{sym} + E_{asym}$, meaning that all power is routed from waveguide 26 into waveguide 24.

Practically, it may be desirable that L be smaller than $L_\pi$, since the bending region introduce some parasitic coupling $\phi_{bend}$. Therefore, L should be chosen so that $2 \times \phi_{bend} + \phi(L) = \pi$. The parasitic bending coupling can be estimated by Finite-Difference-Time-Domain (FDTD) simulation and then validated empirically by varying the coupler length.

Extending the length of first coupling region 54 beyond coupling length $L_{\pi 2}$ would cause the flux at wavelength $\lambda_2$ that has traversed into waveguide 24 to start traversing back into waveguide 26. It is therefore advantageous to separate the waveguides adiabatically after length $L_{\pi 2}$. Although ideally 100% of flux $\Phi_2$ will have traversed from waveguide 26 to waveguide 24 for coupling length $L_{\pi 2}$, the percentage of traversed flux may be lower due to non-ideal factors, such as fabrication tolerances, but it will in practical embodiments exceed 80%. Because of the difference in mode structures and coupling between waveguides 24 and 26 in coupling region 54 for different wavelengths, the coupling length $L_{\pi 1}$ for wavelength $\lambda_1$ at $G_{12}$ will be much longer than $L_{\pi 2}$ (because the shorter wavelength will have a more localized mode). Therefore, only a small fraction of the flux $\Phi_1$, typically 20% or substantially less, will traverse from waveguide 24 to waveguide 26 within coupling region 54.

A second coupling region 58 is similarly designed to couple the flux $\Phi_3$ at wavelength $\lambda_3$ from waveguide 28 into waveguide 24, while causing only minimal transfer of flux at wavelengths $\lambda_1$ and $\lambda_2$ into waveguide 28. The gap and coupling length of coupling region 58 are different from those in coupling region 54 on account of the different wavelengths concerned. Alternatively, the same gap size may be used in both of the coupling regions (as shown in the example of FIGS. 2a and 2b), with the coupling lengths adjusted accordingly.

In one embodiment, waveguides 24, 26, and 28 comprise SiN, which is deposited and etched on a layer of SiO$_2$ on substrate 22. The processes for fabricating these kinds of waveguides are both mature and readily available. The width W of the waveguides in this embodiment is 500 nm and the height H is 220 nm, wherein W and H are further clarified in sectional views 70 and 72 in FIGS. 2a and 3a, below. For a gap of 500 nm, for example, the calculated coupling lengths $L_{\pi 1}$, $L_{\pi 2}$, and $L_{\pi 3}$ for the three wavelengths $\lambda_1$, $\lambda_2$, and $\lambda_3$ are shown in Table 1, below:

TABLE 1

| Coupling lengths for gap = 500 nm | | | |
|---|---|---|---|
| Wavelength RGB | R | G | B |
| Wavelength symbol | $\lambda_3$ | $\lambda_2$ | $\lambda_1$ |
| Wavelength (nm) | 640 | 532 | 450 |
| $L_\pi$ (microns) | 1023.7 | 6506.5 | 43636.1 |

Alternatively, the sizes of the gap may be assigned a different value through a process of optimization with regard to the various parameters of photonic integrated circuit 20, as illustrated in FIG. 1.

Although the directional coupler, as described above, is a geometrically symmetrical structure with respect to the two waveguides forming it, the strong dependence of the coupling length $L_\pi$ on the wavelength, as shown in Table 1, enables an asymmetrical functioning with respect to two different wavelengths. Based on the calculated values from Table 1, a coupling length $L_{\pi 2}$ of 6,506.5 microns will cause a full transfer of the optical flux $\Phi_2$ at wavelength $\lambda_2$=532 nm between the waveguides in coupling region 54. However, this coupling length is much shorter than the coupling length $L_{\pi 1}$=43,636.1 microns that would be required for full transfer of the optical flux $\Phi_1$ at wavelength $\lambda_2$=450 nm. Consequently, while all or most of flux $\Phi_2$ traverses from waveguide 26 to waveguide 24 over the length $L_{\pi 2}$, only a small fraction (crosstalk) of flux $\Phi_1$ traverses from waveguide 24 to waveguide 26. Thus, a cascade of directional couplers, such as those in first and second coupling regions 54 and 58, may be utilized to feed optical fluxes $\Phi_2$ and $\Phi_3$ with longer wavelengths $\lambda_2$ and $\lambda_3$, respectively, from waveguides 26 and 28 into waveguide 24, while simultaneously depleting only a minor fraction of the flux $\Phi_1$ with a shorter wavelength $\lambda_1$ introduced from emitter 42 into waveguide 24.

The crosstalk may be calculated using equation (1) for first and second coupling regions 54 and 58 for equal gaps of 500 nm. As only flux $\Phi_1$ enters first coupling region 54 along waveguide 24, only the crosstalk for this flux from waveguide 24 into waveguide 26 needs to be calculated. However, two fluxes, $\Phi_1$ and $\Phi_2$, enter second coupling region 58 along waveguide 24, requiring the calculation of the crosstalk for both of these fluxes from waveguide 24 to waveguide 28. The calculated results for the crosstalks are given in Table 2, below:

TABLE 2

| | Crosstalk | |
|---|---|---|
| | first coupling region 54 | second coupling region 58 |
| $\Phi_1$ cross-talk | −12.7 dB | −12.2 dB |
| $\Phi_2$ cross-talk | — | −28.7 dB |

In the embodiment shown in FIG. 1, gap $G_{13}$ in coupling region 58 is larger than gap $G_{12}$, and consequently coupling length $L_{\pi 3}$ is longer in this case than coupling length $L_{\pi 2}$. Similar considerations for crosstalk as those shown in Table 2 apply in the embodiment of FIG. 1 with unequal gaps: A small fraction of flux $\Phi_1$ traverses from waveguide 24 into waveguide 26, and exits from output end 38, as shown by an arrow 56. The main portion of flux $\Phi_1$ and the optical flux $\Phi_2$ that has traversed into waveguide 24 exit together from first coupling region 54 within that waveguide and enter second coupling region 58, within which waveguides 24 and 28 run in parallel with a gap $G_{13}$ between them for a length $L_{\pi 3}$. Length $L_{\pi 3}$ is now determined, based on gap $G_{13}$, wavelength $\lambda_3$, and the geometry of waveguides 24 and 28, so that at the end of second coupling region 58, i.e., after propagating over the length $L_{\pi 3}$, all of optical flux $\Phi_3$ (or at least 80% of it) has traversed the gap $G_{13}$ from waveguide 28 into waveguide 24. Small fractions of fluxes $\Phi_1$ and $\Phi_2$ traverse from waveguide 24 into waveguide 28, and exit from output end 40, as shown by arrows 60 and 62.

The main portion of fluxes $\Phi_1$ and $\Phi_2$ and the optical flux $\Phi_3$ that has traversed into waveguide 24 exit from second coupling region 58 within that waveguide and continue to output end 36, where the three fluxes exit, as shown by three arrows 64, 66, and 68, respectively. Thus, three optical fluxes $\Phi_1$, $\Phi_2$, and $\Phi_3$ at three different wavelengths $\lambda_1$, $\lambda_2$, and $\lambda_3$ have been combined by photonic integrated circuit 20 into a single output. This output may be used as a building block for a one- or two-dimensional array of pixels, as will be detailed below.

Substrate 22 may comprise either a semiconductor substrate, such as silicon (Si) or silicon-on-insulator (SOI), or alternatively a dielectric material, such as glass or quartz (silicon dioxide, SiO$_2$). Waveguides 24, 26, and 28 may comprise one or more of the following materials: silicon nitride (Si$_3$N$_4$, also referred to simply as SiN), aluminum oxide (Al$_2$O$_3$), aluminum nitride (AlN), gallium phosphide (GaP), gallium nitride (GaN), or a polymer, such as SU-8 epoxy-based photoresist. The waveguides may be fabricated using standard methods of material deposition and photolithography that are known in the art. Alternatively, waveguides 24, 26, and 28 may be fabricated by ion-implantation in a glass substrate.

Emitters 42, 44, and 46 may comprise edge-emitting lasers, which are coupled to input ends 30, 32, and 34 by, for example, edge-coupling. Alternatively, the emitters may comprise hybrid III-V/Si lasers based on, for example, indium-gallium-nitride (InGaN) or aluminum-gallium-indium-phosphide (AlGaInP), integrated into a Si-based process (when substrate 22 comprises Si or SOI). In this case, each laser resonator is implemented in SiN, and the III-V lasers are formed in the Si-layer and support lasing at the RGB wavelengths. Further alternatively, the emitters may comprise vertical-cavity semiconductor lasers (VCSELs) formed on or bonded to semiconductor substrate 22.

Emitters on semiconductor substrate 22 may be coupled into input ends 30, 32, and 34 using reflectors, diffraction gratings, volume holograms, edge couplers or other methods used in guided-wave optics.

In additional embodiments, photonic integrated circuit 20 may additionally comprise the following sorts of components (not shown in the figures):

Passive waveguide components, such as bends, tapers, directional couplers, tap couplers, and edge couplers;

Active phase control devices implemented by thermal tuning of the refractive index of the waveguides; and Photodetectors, such as photoconductors, photodiodes, or avalanche photodiodes (APD), which are based on Si or other semiconductor materials and coupled to the waveguides. The photodetectors may be used as absorbers for the cross-talk into waveguides 26 and 28, as well as for monitoring the optical flux in the waveguides. The photodetectors may be coupled to waveguides 24, 26, and 28 via tap couplers with a coupling ratio of, for example 1%, thus enabling the functionality of elements of the PIC to be monitored. The photodetectors may alternatively be coupled to the waveguides by evanescent coupling.

Tap couplers in photonic integrated circuit 20 may end with evanescent coupling into a photodetector implemented in a different layer (for example the Si device layer on an SOI wafer or a III-V layer), which are vertically separated from the waveguide by passivating oxide. In order to increase the mode overlap between the photodetector and the waveguide, the waveguide may be narrowed adiabatically to increase the lateral extent of the propagating mode.

Reference is now made to FIGS. 2 and 3a-c, which show details regarding the traversal of optical flux between waveguides 24 and 26, in accordance with an embodiment of the invention. A Cartesian coordinate system 57 of FIG. 1 will be used in FIG. 2 for referencing the geometry of photonic integrated circuit 20. FIG. 2 provides a schematic sectional view 70 of photonic integrated circuit 20, while FIGS. 3a-c show plots 82, 84, and 88 of the associated waveguide modes. Although not shown in FIG. 2, waveguides 24 and 26 can be passivated, for example with $SiO_2$. This passivation can also be used in formation of electrical interconnect routing layers to components such as detectors, lasers, modulators, and thermal tuners, particularly when PIC 20 is formed on an SOI substrate.

Sectional view 70 shows waveguides 24 and 26 along line 53 in FIG. 1, as well as a portion 80 of substrate 22. Cartesian coordinate system 57 is the same as in FIG. 1, but viewed from a different direction. FIGS. 3a and 3b show plots 82 and 84 of the symmetric and antisymmetric waveguide modes, respectively, of the electric field E of optical flux $\Phi_2$ propagating in waveguides 24 and 26 at wavelength $\lambda_2$, as a function of coordinate x and as viewed at line 53, i.e., at the beginning of first coupling region 54. Plots 82 and 84 are aligned in the x-direction below waveguides 24 and 26. Summing up the symmetric and antisymmetric modes of plots 82 and 84 yields a zero electrical field E in waveguide 24 and a non-zero electrical field in waveguide 26, in agreement with FIG. 1.

The symmetric and antisymmetric modes propagate in first coupling region 54, seeing respective effective indices $n_{eff,symm}$ and $n_{eff,asymm}$. Due to the different spatial distributions of these modes, the two effective indices differ from each other: $n_{eff,symm} \neq n_{eff,asymm}$. For example:

At 640 nm: $n_{sym}=1.7365644$, $n_{asym}=1.7365479$.

At 532 nm: $n_{sym}=1.79501482$, $n_{asym}=1.79501394$.

At 450 nm: $n_{sym}=1.839220272$, $n_{asym}=1.839220228$.

Due to this difference between the effective indices, the relative phase between the two modes changes during the propagation, and power traverses from one waveguide to the other, leading to a changing ratio T of traversed flux as a function of propagation length L, as shown in equation (1).

Based on this relation between the symmetric and antisymmetric modes, the coupling length $L_{\pi 2}$ is determined by the geometry and the materials of the waveguides, so that the accumulated phase difference during the propagation of the two modes over the length $L_{\pi 2}$ is $\pi$ (180°). Thus, if at line 53 (at the beginning of first coupling region 54) the relative phase between the two modes is normalized to zero, then at line 55 (at the end of the first coupling region), after having propagated over the length $L_{\pi 2}$, the relative phase is $\pi$ (180°). The cross-section of view 70 is constant over entire first coupling region 54, and—with a suitable phase normalization—the symmetric mode has the same shape at the beginning and the end of the first coupling region (at lines 53 and 55, respectively). Thus, the antisymmetric mode at line 55, shown by plot 88, is inverted (multiplied by $e^{i\pi}=-1$) as compared to plot 84. This inverted antisymmetric mode is illustrated in FIG. 3c.

Summing up the symmetric and antisymmetric modes of plots 82 and 88, respectively, yields a non-zero electric field in waveguide 24 and a zero electric field in waveguide 26, in agreement with full traversal of optical flux $\Phi_2$ at wavelength $\lambda_2$ from waveguide 26 to waveguide 24.

Integrated, Multi-Pixel Light Engines

FIG. 4 is a schematic illustration of a photonic integrated circuit 100, in accordance with another embodiment of the invention. As explained above, PICs of this sort, as well as other PICs described herein, are particularly (although not exclusively) useful as pixel generators for miniaturized projectors, for example in augmented reality applications.

Photonic integrated circuit 100 comprises three sub-circuits 20a, 20b, and 20c, delineated by dotted lines. Sub-circuits 20a, 20b, and 20c are similar to circuit 20 of FIG. 1, and the parts similar to those in circuit 20 are labelled with the same numbers, with a suffix a, b, or c added to the parts belonging to sub-circuits 20a, 20b, and 20c, respectively. For the sake of simplicity, only those parts relevant to the description of photonic integrated circuit 100 are labelled, and the substrate for the circuit has been omitted. The paths of circuits 20a, 20b, and 20c are configured so as to bring their respective output ends 36a, 36b, and 36c to close proximity with each other, separated by gaps 102 and 104. Gaps 102 and 104 are determined by considerations for the wave guiding properties of the waveguides forming circuits 20*a-c* and for the fabrication process of the circuits, as well as the required density of output ends 36*a*, 36*b*, and 36*c* in the end-use of photonic integrated circuit 100. Gaps 102 and 104 are typically 10 microns, but may alternatively be smaller or larger.

Similarly to photonic integrated circuit 20, emitters 42*a*, 44*a*, and 46*a* of sub-circuit 20*a* emit beams of light at wavelengths $\lambda_1$, $\lambda_2$, and $\lambda_3$ to input ends 30*a*, 32*a*, and 34*a*. Further, emitters 42*b*, 44*b*, and 46*b* emit beams of light at wavelengths $\lambda_1$, $\lambda_2$, and $\lambda_3$ to input ends 30*b*, 32*b*, and 34*b*, and emitters 42*c*, 44*c*, and 46*c* emit beams of light at wavelengths $\lambda_1$, $\lambda_2$, and $\lambda_3$ to input ends 30*c*, 32*c*, and 34*c*. Similarly to circuit 20, each sub-circuit 20*a*, 20*b*, and 20*c* combines the majority of the optical fluxes emitted into its respective input ends into a combined, multi-wavelength flux emitted from its respective output ends 36*a*, 36*b*, and 36*c*. These output fluxes are denoted by arrows 64*a*, 66*a*, and 68*a* for circuit sub-20*a*, arrows 64*b*, 66*b*, and 68*b* for sub-circuit 20*b*, and arrows 64*c*, 66*c*, and 68*c* for sub-circuit 20*c*. Due to the proximity of output ends 36*a*, 36*b*, and 36*c*, the combined multi-wavelength outputs of sub-circuits 20*a*, 20*b*, and 20*c* are available to be used as pixels with a pitch determined by gaps 102 and 104, such as, for example, 10 microns. This pitch can be much smaller than the pitch between any of emitters 42*a-c*, 44*a-c*, or 46*a-c*.

FIG. 5 is a schematic top view of an optoelectronic device 110, in accordance with another embodiment of the invention. Device 110 comprises multiple beam sources 114, which are arranged on a substrate 112, for example a semiconductor substrate, such as SOI. Each source 114 is coupled to emit a beam of light into the input end of a respective waveguide 116, such as the sorts of single-mode strip waveguides described above, or multi-mode waveguides. Waveguides 116 curve adiabatically from the input ends to respective output ends 118, which are arranged on substrate 112 in an array having a predefined pitch, for example a pitch less than 10 microns. (For simplicity of illustration, the curves in waveguides 116 are represented by sharp corners in FIG. 5.) As each one of waveguides 116 contains a single color, the dimensions of the waveguides can be varied, for example by narrowing the waveguide width for shorter wavelengths, in order to reduce the crosstalk at the waveguide outputs, and the inter-waveguide gap can thus be minimized.

Each source 114 can comprise a single emitter, such as a laser diode emitting at a selected wavelength, or multiple emitters, each emitting at a different wavelength, with suitable coupling between the different inputs. For example, each source 114 may comprise a structure similar to sub-circuits 20*a*, 20*b* and 20*c*, as described above. In either case, output ends 118 define an array of pixels, comprising at least three pixels, and possibly more. Each pixel outputs light at the wavelength of its respective source 114, when the source contains a single emitter, or at multiple different wavelengths.

Control circuits 115 on substrate 112 apply a different, independent temporal modulation to each source 114. For example, control circuits 115 may modulate the beams emitted by the laser or laser in each source 114 so as to modulate respective colors and/or intensities of the pixels defined by output ends 118. This modulation can be synchronized with a scanner, such as a rotating mirror (not shown), so that pixels of the appropriate colors and intensity are projected at the appropriate pixel locations in a two-dimensional image. Control circuits 115 typically comprise suitable digital logic and analog drive circuits, as are known in the art, for driving and modulating sources 114. Assuming substrate 112 to comprise a semiconductor substrate, such as SOI, control circuits 115 can be fabricated on the substrate alongside the optical and optoelectronic components of device 110.

Figure 6A:
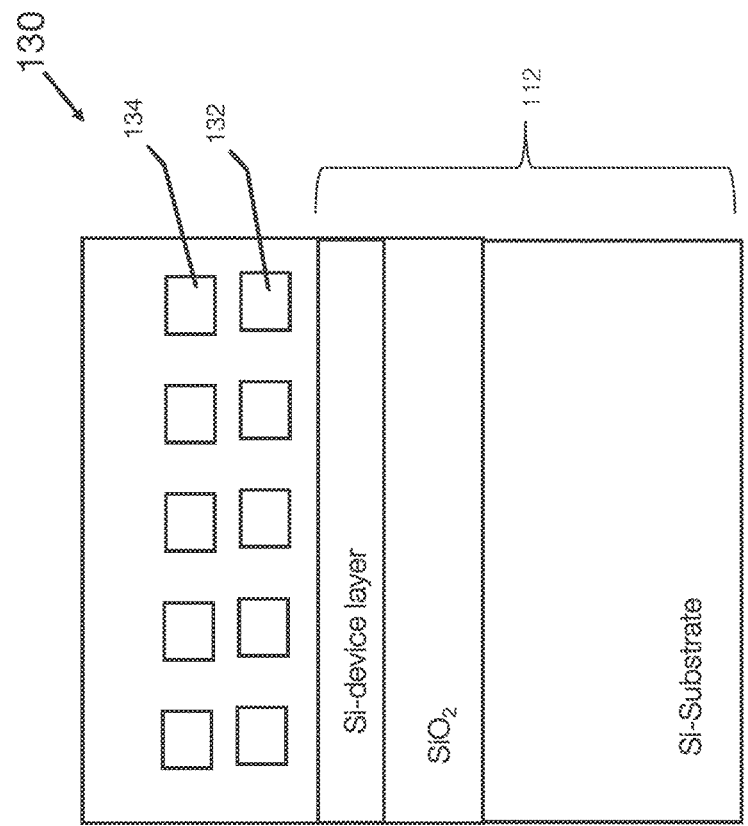
FIG. 6A is a schematic sectional view of the optoelectronic device of FIG. 5, in accordance with an embodiment of the invention.

FIG. 6A is a schematic sectional view of device 110, in accordance with an embodiment of the invention. Substrate 112 comprises a silicon wafer, which is overlaid by a layer of $SiO_2$, over which a silicon device layer is deposited, as is known in the art. Another layer 120 of $SiO_2$ is deposited on substrate 112, followed by a layer 122 of SiN. Layer 122 is patterned and etched to form waveguides 116. Another $SiO_2$ layer 124 is deposited over waveguides. The arrangement enables waveguides 116 to be formed in substantially any desired shape, with a fine pitch at output ends 118, and with suitable coupling to sources 114 (FIG. 5) and other components on substrate 112. Control circuits 115 may likewise be fabricated on substrate 112, as noted above.

Figure 6B:
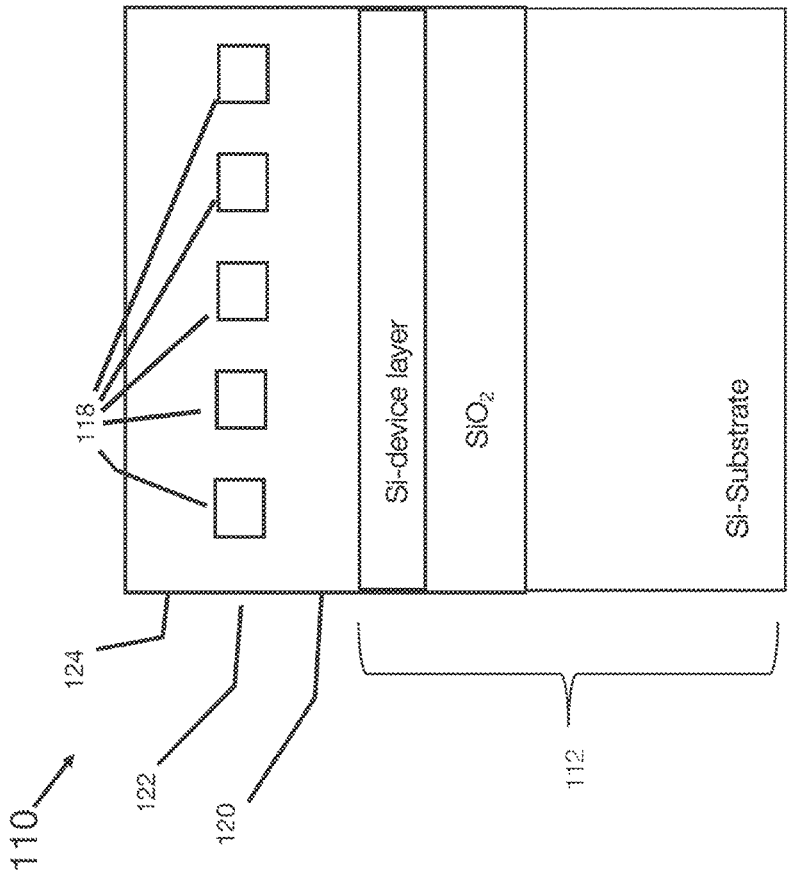
FIG. 6B is a schematic sectional view of an optoelectronic device, in accordance with another embodiment of the invention.

FIG. 6B is a schematic sectional view of an optoelectronic device 130, in accordance with another embodiment of the invention. Device 130 is similar in design and functionality to device 110, except that the waveguides are disposed on substrate 112 in multiple layers. Each such layer comprises SiN, suitably patterned and etched, with intervening layers of $SiO_2$. Output ends 132 and 134 of the waveguides define a two-dimensional (matrix) array. As in the preceding embodiment, each such output end may generate a modulated pixel of a single color or multiple colors. This two-dimension pixel array may similarly be projected by and synchronized with a scanner.

FIGS. 7A and 7B are schematic sectional views of single-layer and triple-layer photonic integrated circuits 200 and 202, respectively, on $SiO_2$ substrates 210, in accordance with embodiments of the invention.

Photonic integrated circuit 200 is similar to photonic integrated circuit 100 of FIG. 4, but in the present embodiment comprises an array of five sub-circuits similar to photonic integrated circuit 20, with five output ends 212*a-e* arranged in a periodic one-dimensional array. The waveguides in circuit 200 can be fabricated, for example, from SiN on $SiO_2$ substrate 210. The sectional view of FIG. 7A is shown across output ends 212*a-e*. Each output end emits light at three wavelengths, for example red, green and blue wavelengths, as explained above.

Photonic integrated circuit 202 is similar to circuit 200, except that the array of sub-circuits, including waveguides and couplers, is now replicated in a second and a third layer. The sub-circuits thus form a two-dimensional array, with fifteen output ends 222*a-o* arranged in a periodic two-dimensional array comprising a 3×5 matrix. Similarly to FIG. 5A, the sectional view of FIG. 7B is shown across output ends 222*a-o*.

Alternatively, both output ends 212*a-e* and output ends 222*a-o* may be arranged in other sorts of patterns, such as a quasi-random array. The fabrication process for circuits 200 and 202 is further detailed in a flowchart 250 in FIG. 8, below.

FIG. 8 is flowchart 250 that schematically illustrates methods for fabricating photonic integrated circuits, in accordance with an embodiment of the invention.

With reference to FIGS. 7A-B, the fabrication of circuits 200 and 202 starts with $SiO_2$ substrate 210 at a start step 252. Alternatively, with reference to FIGS. 6A/B, the fabrication of circuits 110 and 130 starts with an SOI substrate. In a SiN deposition step 254, a layer of SiN is deposited on the substrate, to be subsequently patterned as the waveguides of circuits 110, 130, 200 or 202. In a SiN patterning step 256, waveguides, such as waveguides 116 or 212*a-e*, are formed using photolithographic patterning and etching. The waveguides curve adiabatically between the input and output ends. In a first $SiO_2$ deposition step 258, a layer of $SiO_2$ is deposited over the waveguides. In a CMP step 260, the layer of $SiO_2$, deposited in the previous step, is planarized using chemical-mechanical polishing (CMP).

In embodiments comprising multiple layers of waveguides, such as waveguides 132 and 134 in circuit 130 or 222*a-o* in circuit 202, in a repeat step 264, the process is brought back to SiN deposition step 254, and the process is repeated through CMP step 260. The loop from SiN deposition step 254 through $SiO_2$ deposition step 262 is repeated for each additional layer of waveguides. For example, for circuit 202 two repeat loops are performed. When no more layers of waveguides are required, an additional $SiO_2$ layer is deposited in a passivation step 262 to serve as a passivation layer for the circuit, and the process ends in an end step 266.

When an SOI substrate is to be used, the substrate is prepared by forming an SOI structure on a Si substrate. At this point, active devices, such as detectors, may be fabricated in the SOI structure. After this step, a layer of $SiO_2$ is deposited on the SIO structure, and from here on the process follows steps 254 through 266 of FIG. 8. The layers of SiN may be surrounded above and/or below by III-V components, such as laser sources, amplifiers or detectors. Additionally or alternatively, the waveguides in the SiN layer may be surrounded (above or below) by electronic interconnects formed in metal layers, as well as vias between the metal layers, as is known in the art. These interconnects can serve to contact lasers, detectors, modulators and other electro-optical devices incorporated in the PIC.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device comprising:
a substrate;
at least three emitters, which are disposed on the substrate and are configured to emit respective beams of light;
at least three waveguides, which are disposed on the substrate and have respective input ends coupled to receive the beams of light from respective ones of the emitters, such that each one of the at least three waveguides is coupled to a respective one of the at least three emitters, wherein the waveguides curve adiabatically from the input ends to respective output ends of the waveguides, which are arranged on the substrate in an array having a predefined pitch; and
control circuitry configured to apply a temporal modulation independently to each of the beams of light.

2. The device according to claim 1, wherein the emitters comprise at least first emitters and second emitters, which are configured to emit the light at least at different, first and second respective wavelengths.

3. The device according to claim 2, wherein the emitters are configured to emit the light at first, second and third wavelengths in blue, green and red wavelength ranges, respectively.

4. The device according to claim 1, wherein the pitch does not exceed 10 microns.

5. The device according to claim 1, wherein the array of the output ends is a one-dimensional array.

6. The device according to claim 1, wherein the waveguides are disposed on the substrate in multiple layers, and the array of the output ends is a two-dimensional array.

7. The device according to claim 1, wherein the output ends define pixels in the array, and wherein the control circuitry is configured to modulate the beams emitted by the emitters so as to modulate respective colors and intensities of the pixels.

8. The device according to claim 1, wherein the substrate comprises a semiconductor material.

9. The device according to claim 1, wherein the substrate comprises a dielectric material.

10. The device according to claim 1, wherein the emitters comprise lasers, which are disposed on the substrate.

11. The device according to claim 1, wherein the waveguides comprise strip waveguides formed on the substrate.

12. The device according to claim 11, wherein the strip waveguides are single-mode waveguides.

13. The device according to claim 1, wherein the emitters and waveguides are arranged on the substrate in a plurality of photonic integrated sub-circuits, each sub-circuit comprising:
a first emitter configured to emit a first beam of light at a first wavelength;
a second emitter configured to emit a second beam of light at a second wavelength, which is longer than the first wavelength; and
first and second waveguides, which are disposed along respective first and second paths on the substrate and have respective input ends coupled to receive the first and second beams of light respectively, the first and second paths curving adiabatically from the input ends into a coupling region in which the first and second paths are separated by a gap that is selected such that over a length of the coupling region, at least 80% of an optical flux of the second beam traverses the gap from the second waveguide into the first waveguide, whereupon the light at both the first and second wavelengths is transmitted through an output end of the first waveguide.

\* \* \* \* \*